(12) United States Patent
Naffziger et al.

(10) Patent No.: US 7,148,755 B2
(45) Date of Patent: Dec. 12, 2006

(54) SYSTEM AND METHOD TO ADJUST VOLTAGE

(75) Inventors: Samuel D. Naffziger, Fort Collins, CO (US); Shahram Ghahremani, Fort Collins, CO (US); Christopher A. Poirier, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 87 days.

(21) Appl. No.: 10/648,570

(22) Filed: Aug. 26, 2003

(65) Prior Publication Data

US 2005/0062507 A1    Mar. 24, 2005

(51) Int. Cl.
*H01L 7/16* (2006.01)
*H03J 7/04* (2006.01)

(52) U.S. Cl. ............ 331/16; 331/34; 331/74; 331/177 R; 331/1 R; 331/175; 327/156; 327/42; 327/47; 327/48; 327/49

(58) Field of Classification Search .......... 331/16, 331/34, 74, 177 R, 1 R, 175; 327/156, 42, 327/47, 48, 49
See application file for complete search history.

(56) References Cited

U.S. PATENT DOCUMENTS 5,416,446 A * 5/1995 Holler et al. ............ 331/57
6,157,247 A 12/2000 Abdesselem et al.
6,392,494 B1 * 5/2002 Takeyabu et al. ........... 331/11
6,449,575 B1 9/2002 Bausch et al.
6,509,788 B1 1/2003 Naffziger et al.
2003/0060176 A1 3/2003 Heinonen et al.

OTHER PUBLICATIONS

Thomas D. Burd, et al., "A Dynamic Voltage Scaled Microprocessor System", IEEE Journal of Solid-State Circuits, vol. 35, No. 11, pp. 1571-1580, Nov. 2000.

Shekhar Borkar, et al., "Parameter Variations and Impact on Circuits and Microarchitecture", Circuit Research, Intel Labs, JF3-334, pp. 338-342, Jun. 2003.

* cited by examiner

*Primary Examiner*—Michael B Shingleton

(57) ABSTRACT

A system and method that can be utilized to implement voltage adjustment (e.g., for an integrated circuit). In one embodiment, the system comprises a frequency generator that provides a clock signal having a frequency that varies based on an operating voltage. The system also includes a controller that provides a control signal to adjust the operating voltage based on adjustments to the frequency of the clock signal.

10 Claims, 6 Drawing Sheets

SYSTEM AND METHOD TO ADJUST VOLTAGE

BACKGROUND

Power consumption and operating frequency are two important considerations in the design and operation of very large scale integration (VLSI) devices. It is known that power consumption is dependent on both a supply voltage and operating frequency. The basic relationship for power consumption for an integrated circuit (IC) chip can be expressed as follows:

$$P = C \times V^2 \times F \qquad \text{EQ.1}$$

where P=power,
C=switching capacitance,
V=supply voltage, and
F=operating frequency.

From Eq. 1, it is shown that power consumption varies at least quadratically as a function of the supply voltage. For instance, about a 10% increase in supply voltage results in about a 21% increase in power. However, where frequency is further dependent on the supply voltage, such as for a voltage controlled oscillator, the relationship between power consumption and voltage is approximately cubic.

Process variations associated with fabrication of IC chips can cause a significant performance degradation associated with one or more of the power-related parameters. In general, process variations can include lot-to-lot variations, wafer-to-wafer variations, die-to-die variations and within-die variations. Significantly, with the continued scaling of VLSI chips, including those employing CMOS and Bipolar-CMOS technologies, process variations can have a significant impact on the supply voltage as well as the operating frequency of the chip.

SUMMARY

One embodiment of the present invention may comprise a system that includes a frequency generator that provides a clock signal having a frequency that varies based on a reference voltage. A controller provides a control signal to adaptively adjust the reference voltage based on adjustments to the frequency of the clock signal.

Another embodiment of the present invention may comprise a method that includes determining whether adjustments to an operating frequency of an integrated circuit are within expected operating parameters over a plurality of clock cycles. The voltage is adjusted based on the determination.

DETAILED DESCRIPTION

This disclosure relates generally to an approach that can be utilized to provide adaptive voltage control (e.g., for an IC chip). The voltage can be adapted, for example, based on detecting one or more symptoms indicative of wasted power, such as can be referred to as a "throttle event", or lack thereof. For example, a throttle event corresponds to a modification in operating frequency (e.g., a reduction or increase), such as implemented to facilitate operation of IC components in response to a corresponding modification in the voltage. The approach described herein may enable a designer and user to control the number of throttle events at a level that provides a desired balance between operating frequency and operating voltage, thus mitigating wasted power.

Figure 1:
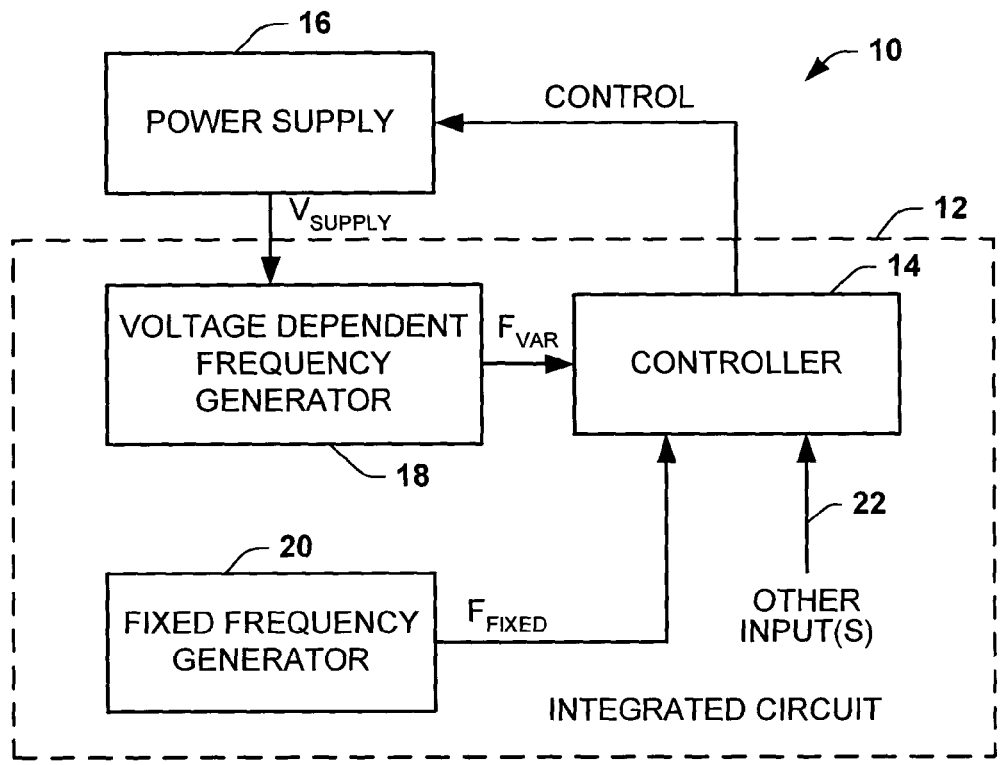
FIG. 1 is a block diagram of one embodiment of a system to provide adaptive voltage control.

FIG. 1 depicts a system 10 that adjusts a supply voltage. The system 10 can be implemented on an IC 12, such as a VLSI chip (e.g., a microprocessor, an application specific integrated circuit (ASIC)) or the like. The system 10 in one embodiment enables the IC 12 to achieve a desired relationship between operating voltage and operating frequency, which may be used to improve overall power efficiency of the IC chip despite potential process variations that may occur. Process variations can include lot-to-lot variations, wafer-to-wafer variations, die-to-die variations as well as within-die variations.

A controller (e.g., a microcontroller) 14 provides a CONTROL signal for controlling an associated power supply 16. The power supply 16 provides a supply (or other operating) voltage $V_{SUPPLY}$ to the IC chip 12 based on the CONTROL signal. The CONTROL signal causes the power supply 16 to adjust $V_{SUPPLY}$ in response to the controller 14 detecting one or more symptoms of wasted power in the integrated circuit 12, namely, a throttle event. For example, the controller 14 can determine an indication of wasted power (e.g., the occurrence or absence of a throttle event) based on changes or adjustments to a voltage dependent signal having a frequency $F_{VAR}$, which is provided by a voltage dependent frequency generator 18. For instance, an indication of the adjustments to the signal having frequency $F_{VAR}$ can be determined based on comparing such signal with a signal having a substantially fixed predetermined frequency $F_{FIXED}$. In this way, the controller 14 can provide a power control loop to help maintain a desired relationship between $V_{SUPPLY}$ and the operating frequency $F_{VAR}$ of the IC chip 12. While the power supply 16 is depicted as being external to the IC chip 12, it is to be understood and appreciated that the power supply could be integrated with the chip 12.

In the example of FIG. 1, the system 10 includes one or more voltage dependent frequency generators 18 that provide a variable frequency signal $F_{VAR}$ to the controller 14. In particular, the voltage dependent frequency generator 18 provides the oscillating output signal at the operating frequency $F_{VAR}$ as a function of the supply voltage $V_{SUPPLY}$. A frequency generator 20 can be programmed and/or configured to provide an output signal having a desired maximum frequency $F_{FIXED}$ for the IC chip 12. Thus, by comparing $F_{VAR}$ with $F_{FIXED}$ the controller 14 can ascertain whether symptoms of wasted power or an improper balance between $V_{SUPPLY}$ and $F_{VAR}$ exist. The controller 14 can determine a symptom of wasted power, for example, by comparing relative timing characteristics (e.g., the number of cycles in some preset period) of the signals provided by the frequency generators 18 and 20. Wasted power can be determined based on whether the supply voltage is too high or too low for efficient operation at (or near) the desired maximum frequency defined by $F_{FIXED}$.

By way of example, the voltage dependent frequency generator 18 is programmed and/or configured to implement a high bandwidth loop (e.g., part of a clock signal control loop) that adapts the frequency $F_{VAR}$ of its output signal according to the supply voltage $V_{SUPPLY}$. The adaptation of the frequency $F_{VAR}$ can be considered substantially instantaneous in that it adjusts the cycle time of the signal to enable the components and devices of the IC chip 12 to operate in response to fluctuations in the supply voltage $V_{SUPPLY}$. It is understood that a supply voltage $V_{SUPPLY}$ usually includes fluctuations or high frequency components (e.g., voltage overshoot or voltage droop) when considered at short cycle times associated with the signal provided by the frequency generator 18. The fluctuations in the supply voltage $V_{SUPPLY}$ can affect the overall power consumption of the chip according to EQ. 1 noted above. The frequency generator 18 thus is operative to mitigate the effects of such voltage fluctuations by adjusting the instantaneous frequency $F_{VAR}$ (up or down) accordingly.

For instance, during a droop in the supply voltage $V_{SUPPLY}$, the frequency generator 18 can stretch the cycle time of the output signal (or decrease $F_{VAR}$). Alternatively, stalls can be injected into the IC (e.g., a processor) to reduce switching activity and thus reduce voltage droop. The stretching of cycle time and/or the use of stalling could be counted and employed as the indicator for voltage adaptation. After the droop in $V_{SUPPLY}$ has corrected to enable normal operation, the frequency generator 18 can increase the frequency $F_{VAR}$ back to an appropriate level according to $V_{SUPPLY}$. As described herein, a voltage-induced adjustment to the frequency $F_{VAR}$ of the output signal corresponds to a throttle event. Alternatively or additionally, a voltage-induced stalling of the IC operation can also correspond to a throttle event. Those skilled in the art will appreciate other types of throttle events that can be utilized as an indicator that voltage adaptation by the controller 14 is desired. Each throttle event typically occurs over one or a few cycle times of the clock signal control loop to implement substantially instantaneous adjustments to the operating frequency $F_{VAR}$.

The controller 14 provides the control signal to the power supply 16 based on throttle events that may occur over a plurality of cycle times for the clock signal control loop. Thus, the controller 14 implements power control or regulation (as part of a power control loop) at a much lower bandwidth than the adjustments implemented by the frequency generator 18. For example, the frequency generator 18 can implement frequency adjustments (e.g., as part of the clock signal control loop) with a cycle time in the nanosecond range, whereas the controller 14 may implement changes (e.g., as part of the power control loop) to the supply voltage with a cycle time in the microsecond range. By operating the power control loop with a much slower cycle time than the timing signals associated with the frequency generators 18 and 20, the controller 14 can perform time averaging on the $F_{VAR}$ signal to ascertain a time-averaged indication of the throttle events. The cycle time in which the controller 14 dynamically adjusts the supply voltage $V_{SUPPLY}$ can be a fixed number of cycles for the clock signal control loop or, alternatively, a time period specified by other timing circuitry (not shown). Additionally, the adjustments of the $V_{SUPPLY}$ signal can be incremental for each power control cycle according to the number, type and/or duration of throttle events that occur each power control cycle. In this way, the effect of changes in the supply of voltage $V_{SUPPLY}$ on $F_{VAR}$ will facilitate desired behavior of circuitry of the IC 12.

The controller 14 further can receive one or more other inputs, indicated at 22, based on which the control signal can be provided to dynamically adjust the supply voltage $V_{SUPPLY}$ provided by the power supply 16. The other inputs 22, for example, can include an indication of the thermal characteristics (e.g. temperature) of the IC 12 as well as other power-related characteristics thereof. The controller 14 thus can implement the adjustments on the supply voltage $V_{SUPPLY}$ based on a combination of factors, including the relative frequencies $F_{VAR}$ and $F_{FIXED}$ and the other inputs 22. This results in more efficient power consumption for operating the IC chip 12 at or near a desired maximum frequency.

Figure 2:
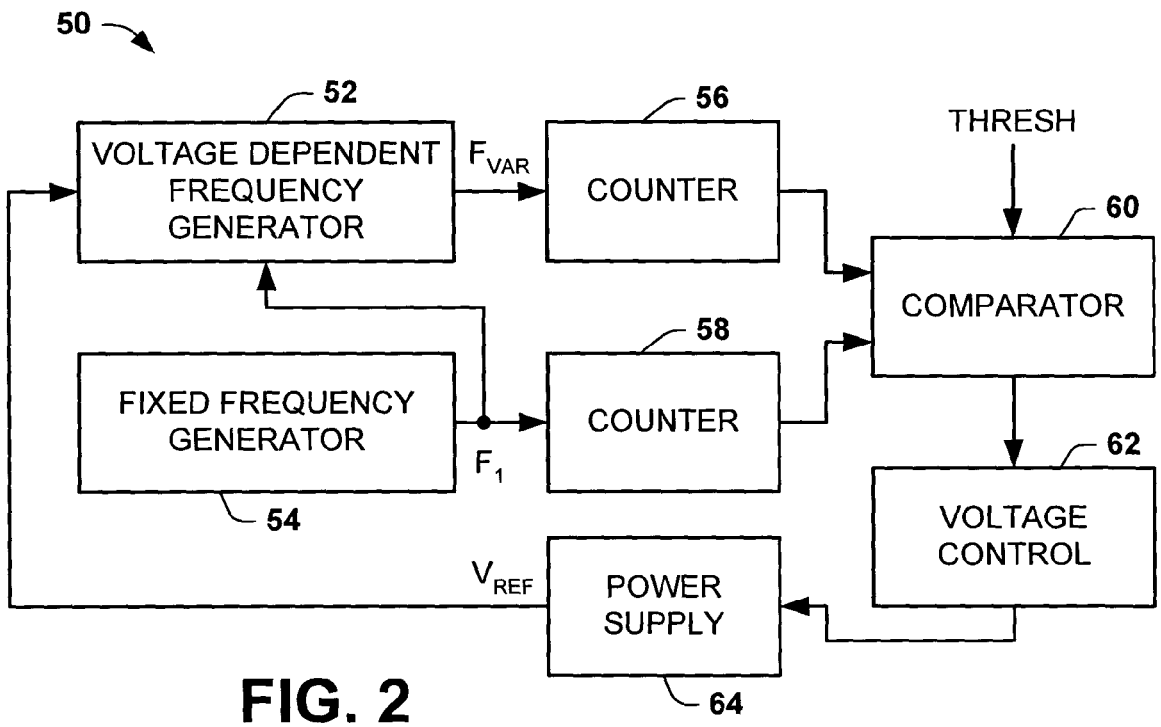
FIG. 2 is an example of another system that can be utilized to provide adaptive voltage control.

FIG. 2 illustrates a system 50 that can be utilized to implement adaptive voltage control. The system 50 includes a voltage dependent frequency generator 52 that is operative to provide a signal at a frequency $F_{VAR}$ that varies as a function of a reference voltage $V_{REF}$ and an input signal at a substantially fixed frequency, indicated at $F_1$. For example, the reference voltage $V_{REF}$ can correspond to an operating voltage of an integrated circuit chip implementing the system 50.

A fixed frequency generator 54 can be operative to provide the signal at frequency $F_1$, which alternates between normally high and normally low levels at the desired frequency $F_1$. The fixed frequency generator 54, for example, can be implemented as a ring oscillator structure configured to run at substantially the same speed as a desired maximum chip clock. Alternatively, the fixed frequency generator 54 can be derived directly from a system clock prior to implementing frequency control on such signal.

For purposes of the example of FIG. 2, it will be assumed that the variable frequency signal $F_{VAR}$ is tuned to match the fixed frequency $F_1$ for a desired nominal value of the reference voltage $V_{REF}$. As $V_{REF}$ decreases or increases in voltage, $F_{VAR}$ decreases or increases accordingly. Thus, the frequency $F_{VAR}$ follows the reference voltage $V_{REF}$.

The system 50 also includes counters 56 and 58 that receive the signals having frequencies $F_{VAR}$ and $F_1$, respectively. The counters 56 and 58 maintain a cycle count for the respective signals according to their frequencies $F_{VAR}$ and $F_1$. The counters 56 and 58 provide respective count values to an associated comparator 60. The comparator 60 is operative to compute a difference between the count values provided by the counters 56 and 58 and, in turn, compare the difference relative to one or more threshold values indicated at THRESH. The comparator 60 may perform this comparison over a time period (or cycle) that includes a plurality (e.g., likely in the thousands) of the cycles associated with the frequencies $F_1$ and $F_{VAR}$. That is, the comparator performs a given adjustment in the power control cycle time, which is substantially greater than the cycle time associated with signals provided by the frequency generators 52 and 54. For example, for each power control cycle time, each of the counters 56, 58 will increment a plurality of times, with the difference between counter values providing an indication of voltage-based adjustments to the frequency $F_{VAR}$ (e.g., throttle events).

By way of example, if the counter 56 provides a count value that is less than the counter 58, this indicates that the reference voltage $V_{REF}$ has caused the frequency generator to decrease $F_{VAR}$, such as to stretch is associated cycle time. Where the difference indicates the occurrence of throttle events, but not at level that exceeds a corresponding threshold value THRESH, the comparator can provide a control signal indicating that no change in the voltage $V_{REF}$ is required. This corresponds to a desired operating condition in which there are a sufficient number of throttle events to maintain the desired operating frequency but not waste too much power.

Where the difference between the counter values exceeds a corresponding threshold value THRESH, the comparator 60 provides a control signal to a voltage control block 62, indicating that an incremental increase in voltage $V_{REF}$ is desired. The voltage control block 62 provides a control signal identifying a voltage to a power supply 64, which provides the voltage $V_{REF}$ accordingly. In contrast, if the count value provided by the counter 56 is greater than or equal to the count value provided by the counter 58, this indicates a condition in which the reference voltage $V_{REF}$ is too high. In this case, the comparator 60 can provide the control signal to the voltage control block 62 to provide a corresponding decrease in the voltage $V_{REF}$. The voltage control block 62 in turn provides a signal to the power supply 64 identifying an incrementally lower voltage, which results in a corresponding decrease in the voltage $V_{REF}$. Alternatively or additionally, a system 50 could employ stall events to reduce switching activity and in turn reduce voltage droop.

In this way, the comparator 60 and voltage control block 62 cooperate as part of a power control loop to maintain the voltage $V_{REF}$ at a level such that at $F_{VAR}$ is slightly less than $F_1$. This results in more efficient use of power (e.g., substantially optimal power consumption) in the system 50 as well as in an integrated circuit implementing such system. The threshold THRESH can be set to maintain $F_{VAR}$ to within a desired percentage of the desired maximum frequency $F_1$ (e.g., about 97% or greater). For example, threshold can define two or more operating categories for the operating frequency $F_{VAR}$ (e.g., $0.99*F_1 \leq F_{VAR} \leq F_1$.).

Figure 3:
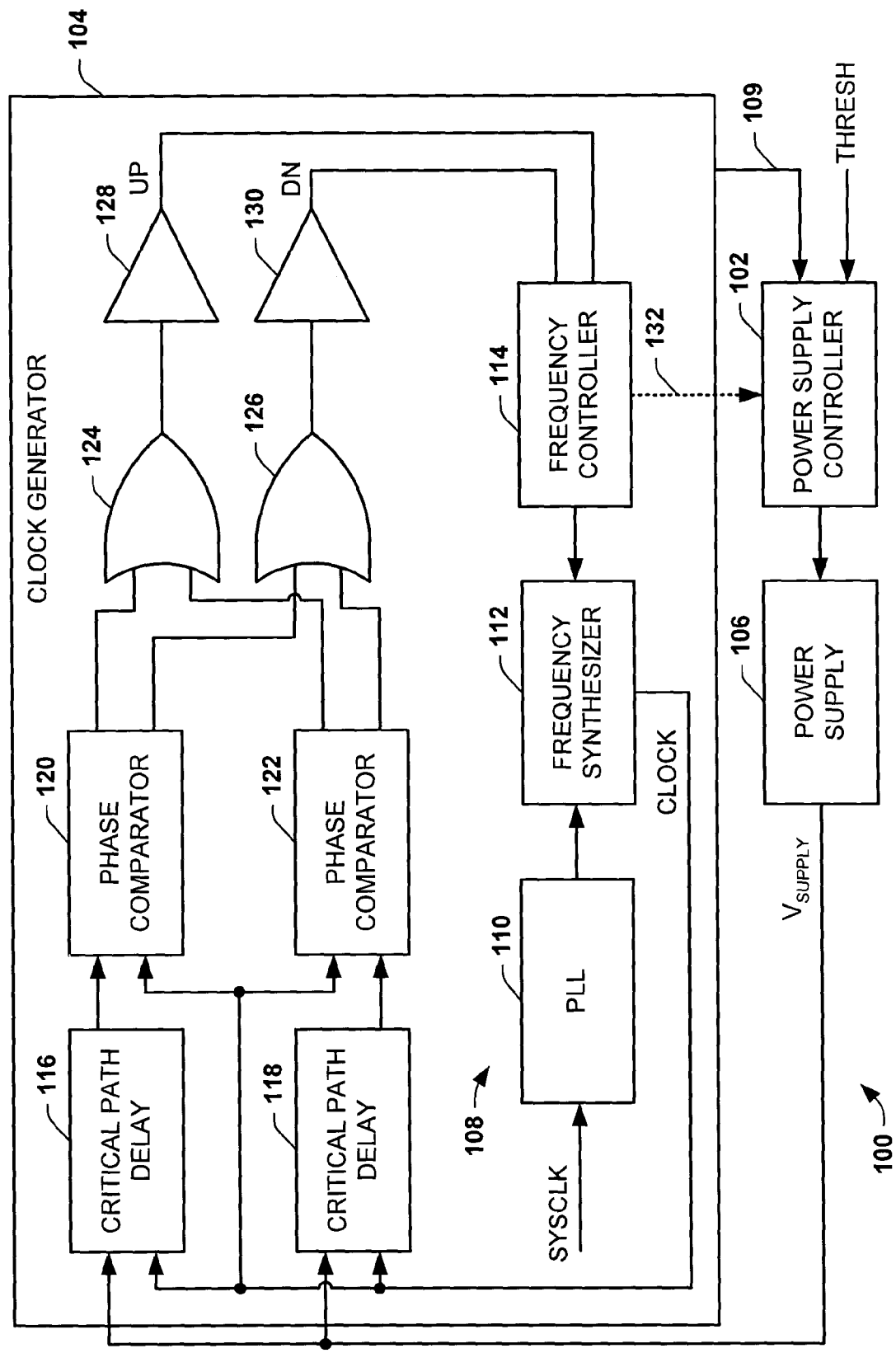
FIG. 3 depicts still another example system to provide adaptive voltage control.

FIG. 3 depicts an example of a voltage regulation system 100 implementing a power supply controller 102. The system 100 includes a clock generator 104 that provides a CLOCK signal having a frequency that varies based on a supply (or operating) voltage $V_{SUPPLY}$ provided by a power supply 106. The power supply controller 102 is coupled to control the power supply 106. The power supply controller 102 provides a control signal to the power supply 106 that can dynamically adjust the supply voltage $V_{SUPPLY}$ (e.g., an increase or decrease in $V_{SUPPLY}$) to achieve a desired balance between the supply voltage $V_{SUPPLY}$ and the frequency of the CLOCK signal. The controller 102 can implement this balance based on detecting one or more symptoms indicative of wasted power, such as can be indicated by frequency changes implemented on the CLOCK signal (e.g., throttle events).

The power supply controller 102 operates to adapt the supply voltage $V_{SUPPLY}$ over a cycle time that is greater than the cycle time associated with the CLOCK signal, such that numerous adjustments on the CLOCK frequency typically occur with each determination to adjust the supply voltage. Stated differently, the power supply controller 102 can dynamically adjust the supply voltage $V_{SUPPLY}$ based on a time averaged indication of throttle events associated with adjustments to the CLOCK signal.

It will be appreciated that the power supply controller 102 can leverage the existing clock generator 104 and associated circuitry to implement desired adaptive voltage control. Those skilled in the art will appreciate various types and configurations of clock generators, such as implemented in VLSI chips (e.g., microprocessors, ASICs), which could be utilized in conjunction with a power supply controller.

The clock generator 104 includes a frequency synthesis path 108 that receives a system clock (SYSCLK) signal, such as can be generated off chip from the system 100. The frequency synthesis path 108 processes the SYSCLK signal to generate a CLOCK signal (e.g., a chip clock signal) for the IC chip that includes system 100. The clock generator 104 also provides one or more signals 109 to the power supply controller 102 based on which adaptive voltage control is implemented.

In the example of FIG. 3, the frequency synthesis path 108 includes a phase locked loop (PLL) 110 that receives the SYSCLK signal and multiplies the SYSCLK signal up to a desired maximum frequency for the system 100. The PLL 110 provides the maximum frequency signal to a frequency synthesizer (e.g., a digital frequency divider) 112 that generates the CLOCK signal. The frequency synthesizer 112 is operative to adjust the cycle time of the CLOCK signal up or down based on a control signal provided by a frequency controller 114.

The clock generator 104 also includes one or more critical path delay networks 116, 118 that receive the CLOCK signal from the frequency synthesizer 112. The path delay networks 116 and 118 also receive the supply voltage $V_{SUPPLY}$ from the associated power supply 106. The path delay networks 116 and 118 provide respective delayed versions of the CLOCK signal to associated phase comparators 120 and 122. Each of the path delay networks 116 and 118 can be configured or tuned to emulate operating characteristics (e.g., cycle time) of an associated critical path of the IC implemented in the associated system 100.

For example, each critical path delay network 116, 118 is tuned to provide the signal in phase with (or matched to) the CLOCK signal at the predefined nominal supply voltage as well as vary the amount of delay as a function of the supply voltage $V_{SUPPLY}$ consistent with the critical path represented thereby. Alternatively, the critical path delay networks 116, 118 could be tuned to match a fractional part of the clock cycle at a nominal supply voltage well as vary the delay as a function of the supply voltage accordingly. Additionally, the critical path delay network 116 can be configured to respond differently to changes in the supply voltage $V_{SUPPLY}$ than the other critical path delay network 118. While two such critical path delay networks and associated circuitry are shown in FIG. 3, it will be understood that any number of one or more such networks can exist across the system 100. Additionally, by distributing such delay networks across the IC chip implementing the system 100, within-die process variations can be mitigated.

The phase comparator 120 compares the delayed clock signal from the critical path delay network 116 with the CLOCK signal from the frequency synthesizer 112. The phase comparator 120 provides respective output signals to OR gates 124 and 126. The other phase comparator 122 compares the delayed clock signal from the critical path delay network 118 with the CLOCK signal from the frequency synthesizer 112. The phase comparator 120 provides respective output signals to OR gates 124 and 126. The phase comparators 120 and 122 thus provide an indication of the instantaneous supply voltage, which determines whether an adjustment to the frequency of the CLOCK signal is desired. For example, one of the OR gates 124 receives output signals that indicate a phase lead between the CLOCK signal and one or both of the delayed CLOCK signals from the critical path delay networks 116 and 118. The other OR gate 126 receives signals from that indicate indicates a phase lag between the CLOCK signal and one or both of the delayed CLOCK signals from the critical path delay networks 116 and 118.

The OR gate 124 thus provides an output signal to a buffer 128 indicative of whether the frequency of the CLOCK signal should be decreased (e.g., increase cycle time) to compensate the detected phase lead. Similarly, the OR gate 126 provides an output signal to another buffer 130 to indicate whether the frequency of the CLOCK signal should be increased (e.g., a decrease in cycle time) to reduce the detected phase lag. The respective buffers 128 and 130 provide corresponding UP and DN signals to the frequency controller 114 to implement substantially instantaneous adjustments to the CLOCK signal. As mentioned above, the frequency controller 114, in turn, provides the control signal to the frequency synthesizer 112 for adjusting the CLOCK cycle (e.g., to stretch or shorten the cycle) accordingly.

Each time the frequency controller 114 causes the frequency synthesizer 112 to implement a change in the CLOCK signal corresponds to a throttle event. F, the power supply controller 102 can implement adaptive voltage control in response to throttle events corresponding to short reductions in frequency, such as are utilized to decrease the cycle time of the CLOCK signal when the voltage is too low. The frequency synthesizer 112 dynamically implements throttle events to increase or decrease the CLOCK cycle time, as needed, based on the cycle time between the CLOCK signal relative to voltage-dependent delays associated with the critical paths of the IC. For example, stretching the cycle time of the CLOCK signal enables the critical path to operate at a corresponding reduced voltage. As the cycle time stretches in response to a decrease in frequency implemented by the frequency synthesizer 112 (indicated by the UP signal), a voltage droop can more easily resolve itself. On the other hand, where the CLOCK signal cycles through the critical path delay faster than the desired minimum cycle time (or maximum frequency), it may be desirable to decrease the cycle time (or increase the frequency), such as indicated by the DN signal to the frequency controller; although typically not exceeding the maximum frequency.

As mentioned above, the power supply controller 102 provides a control signal to the power supply 106 for dynamically adapting $V_{SUPPLY}$ as a function of the throttle events, such as indicated by the signal 109. The power supply controller 102 provides the voltage control signal based on a comparison of the indication of throttle events relative to one or more thresholds, indicated at THRESH. The one or more thresholds THRESH can be programmed according to the particular application and/or customer acceptability standards. A threshold, for example, can be set to a percentage value (e.g., percentage number throttle events or a percentage of a maximum operating frequency) that can be achieved in the time associated with a given power control cycle. As mentioned herein, a power control cycle is typically much greater in duration than a clock cycle associated with the CLOCK signal provided by the clock generator 104.

By way of further example, the power supply controller 102 can receive an indication of the throttle events directly from the frequency controller 114 as a function of the buffered UP and/or DN signals (e.g., as indicated by the dotted line 132). For example, the frequency controller 114 or the power supply controller 112 can determine throttle event characteristics (e.g., the number, type and duration of events) by comparing the UP and DN signals over each power control cycle. A comparison between the number of cycles for the CLOCK signal and the maximum desired clock signal during a power control cycle can provide an indication of the number of throttle events. Because the cycle times associated with the CLOCK signal can increase or decrease, as indicated by the frequency controller 114, the number of CLOCK cycles provides a time-averaged indication of the throttle events. The system 100 thus employs power supply controller 102 to implement an adaptive supply voltage to achieve a desired balance between the operating frequency of the CLOCK signal and the supply voltage $V_{SUPPLY}$. This results in improving power efficiency of the system 100 as well as the IC implementing the system.

Figure 4:
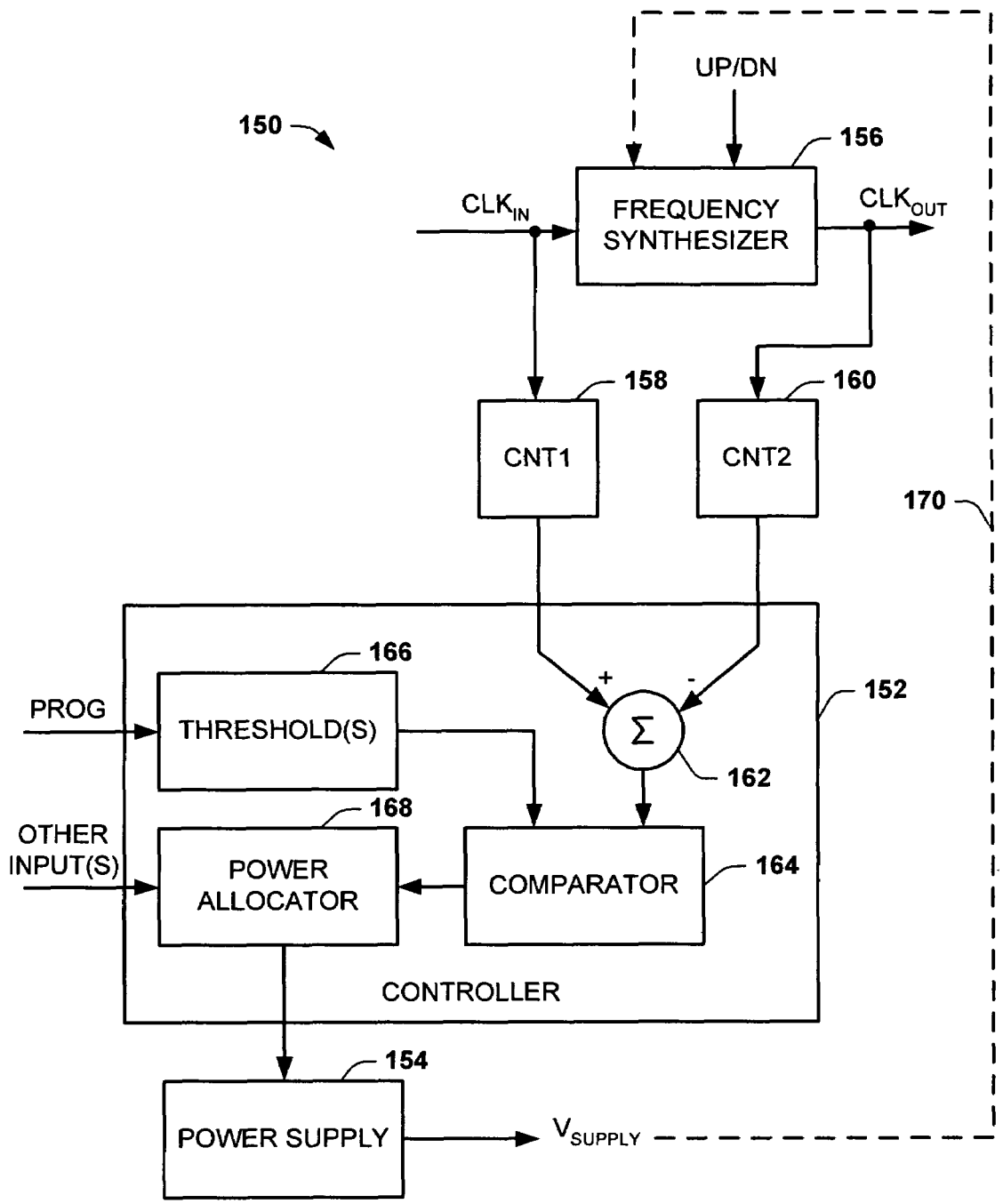
FIG. 4 depicts an example of a power supply control system that can be implemented.

FIG. 4 depicts another example of a system 150 that can implement adaptive voltage control for an integrated circuit chip. The system 150 includes a controller 152 that provides a control signal to an associated power supply 154 for implementing adaptive voltage control for the supply voltage $V_{SUPPLY}$ provided by the power supply. The controller 152 provides the control signal based on an input clock signal $CLK_{IN}$ and an output clock $CLK_{OUT}$ (e.g., a chip clock signal).

By way of example, a frequency synthesizer 156 provides the $CLK_{OUT}$ signal based on the input clock signal $CLK_{IN}$ having a desired maximum frequency ($F_{MAX}$) and based on an UP/DN control signal. The maximum frequency $F_{MAX}$ is a fixed frequency according to application requirements for the system 150 and the associated ICs implementing the system. The $CLK_{IN}$ signal, for example, is provided (e.g., by a phase locked loop) based on a system clock signal according to customer specifications. Alternatively, the $CLK_{IN}$ signal can be provided by a ring oscillator tuned to $F_{MAX}$. For example, as shown and described herein, the frequency of the $CLK_{OUT}$ signal can also vary based on $V_{SUPPLY}$, illustrated schematically at 170. The frequency synthesizer 156 implements adjustments on the $CLK_{IN}$ signal based on the UP/DN control signal, such as provided by frequency control circuitry (not shown). That is, the frequency synthesizer 156 thus provides the $CLK_{OUT}$ signal to have a variable frequency that can be incrementally adjusted based on the UP/DN control signal.

A counter (CNT1) 158 also receives the $CLK_{IN}$ signal and counts the number of cycles associated with such signal. Similarly, another counter (CNT2) 160 receives the $CLK_{OUT}$ signal from the frequency synthesizer 156 and counts the number of cycles associated with the $CLK_{OUT}$ signal. The counters 156 and 158 can be reset each power control cycle, such as by the controller 152. Under ideal circumstances, the frequency of the $CLK_{OUT}$ signal would be equal to the maximum frequency $F_{MAX}$ of the $CLK_{IN}$ signal. However, in practice the $CLK_{OUT}$ signal normally varies during operation, such as to adjust the frequency according to high-frequency fluctuations in the supply voltage. In the example of FIG. 4, the frequency of the $CLK_{OUT}$ signal can vary based on the UP/DN signal causing corresponding increases or decreases in the cycle time of the $CLK_{OUT}$ signal. For example, an UP signal can refer to an increase in the cycle time (a decrease in frequency) and a DN signal can result in a decrease in cycle time (or an increase in frequency). Changes in the frequency of the $CLK_{OUT}$ signal define throttle events.

A throttle event can correspond to an increase in cycle time (or decrease in frequency) associated with the $CLK_{OUT}$ signal, such as based on the UP/DN control signal. For example, short reductions in frequency can occur when the supply voltage $V_{SUPPLY}$ is too low and an increase in cycle time is required to enable proper operation of the associated circuitry in the IC. Because the cycle time stretches in response to decrease in the frequency (or by implementing stall events in the associated IC), a voltage droop can more efficiently resolve itself, typically in one or a few clock cycles. If no throttle events exist during operation (e.g., during a given power control cycle), it has been determined that the voltage is too high resulting in wasted power. Therefore, it is desirable to have a low percentage (e.g., from 0.1% to 0.2%) of throttle events associated with each power control cycle. This balances the ability to detect the optimal voltage with the performance impact of a reduced frequency. A power control cycle typically covers on the order of a thousand or more cycles associated with the $CLK_{OUT}$ signal or the $CLK_{IN}$ signal. Further, because the adjustments in the CHP_CLK signal implemented by the frequency synthesizer 156 correspond to a fractional portion of a given clock cycle, a difference of a single count between the values of counters 160 and 162 usually will correspond to a plurality (e.g., hundreds or thousands) of throttle events.

The controller 152 is programmed and/or configured to adjust the supply voltage $V_{SUPPLY}$ dynamically based on the number of detected throttle events. The controller 152 includes a summation block 162 that is operative to compute a difference between the count values provided by the counters 158 and 160. This difference is provided to a comparator 164. The comparator 164 compares the difference between the count values relative to one or more thresholds, indicated at 166. The one or more thresholds 166 can be programmed (e.g., by the user or at design time) based on a program signal PROG. The threshold values can be set based on customer acceptability and/or the application in which the system 150 is being implemented. The PROG signal thus defines the one or more thresholds that control the circumstances (e.g., the number of throttle events) in which the controller 152 will dynamically adjust the supply voltage $V_{SUPPLY}$ (up or down)

In the example of FIG. 4, the one or more thresholds 166 can represent predetermined count difference values (which can be positive or negative) that establish ranges over which desired adjustments will be made to the supply voltage. There can be a fixed number of one or more thresholds. Alternatively, the one or more thresholds 166 can be stored as a substantially continuous set of data (e.g., a functional characterization or curve, a look-up table and the like) that varies as a function of the count difference to implement a desired amount of adjustment to the supply voltage $V_{SUPPLY}$ depending upon the count difference value. The comparator 164, for example, provides a comparator signal to implement corresponding adaptive voltage control according to power control cycle time. The power control cycle time is substantially greater (e.g., more than about 100 times greater) than the cycle time associated with the $CLK_{OUT}$ signal and the $CLK_{IN}$ signal. By way of further example, the $CLK_{OUT}$ signal can be designed to operate at frequency of approximately 2.5 gigahertz (e.g., a cycle time of about 400 picoseconds), whereas the controller 152 implements adjustments on the supply voltage at a cycle time of about every four microseconds.

The comparator 164 provides the comparator output signal to a power allocator 168 indicative of the count difference value relative to the one or more thresholds 166. The power allocator 168 provides a corresponding control signal to the power supply 154. The power allocator 168 provides an indication of the desired voltage to be provided by the power supply within a corresponding voltage range associated with the power supply 154. The power allocator 168, for example, provides an N-bit control word, where N is an integer greater than or equal to one, which defines a voltage resolution for the supply voltage $V_{SUPPLY}$. By way of example, the supply voltage $V_{SUPPLY}$ can vary between 0.8 V and 1.2 V and the N-bit word provided by the power allocator 168 can vary at 12.5 mV increments in such range, thereby providing approximately thirty-two different possible voltage levels. Those skilled in the art will understand and appreciate than any desired voltage resolution can be implemented by the power allocator 168.

Figure 5:
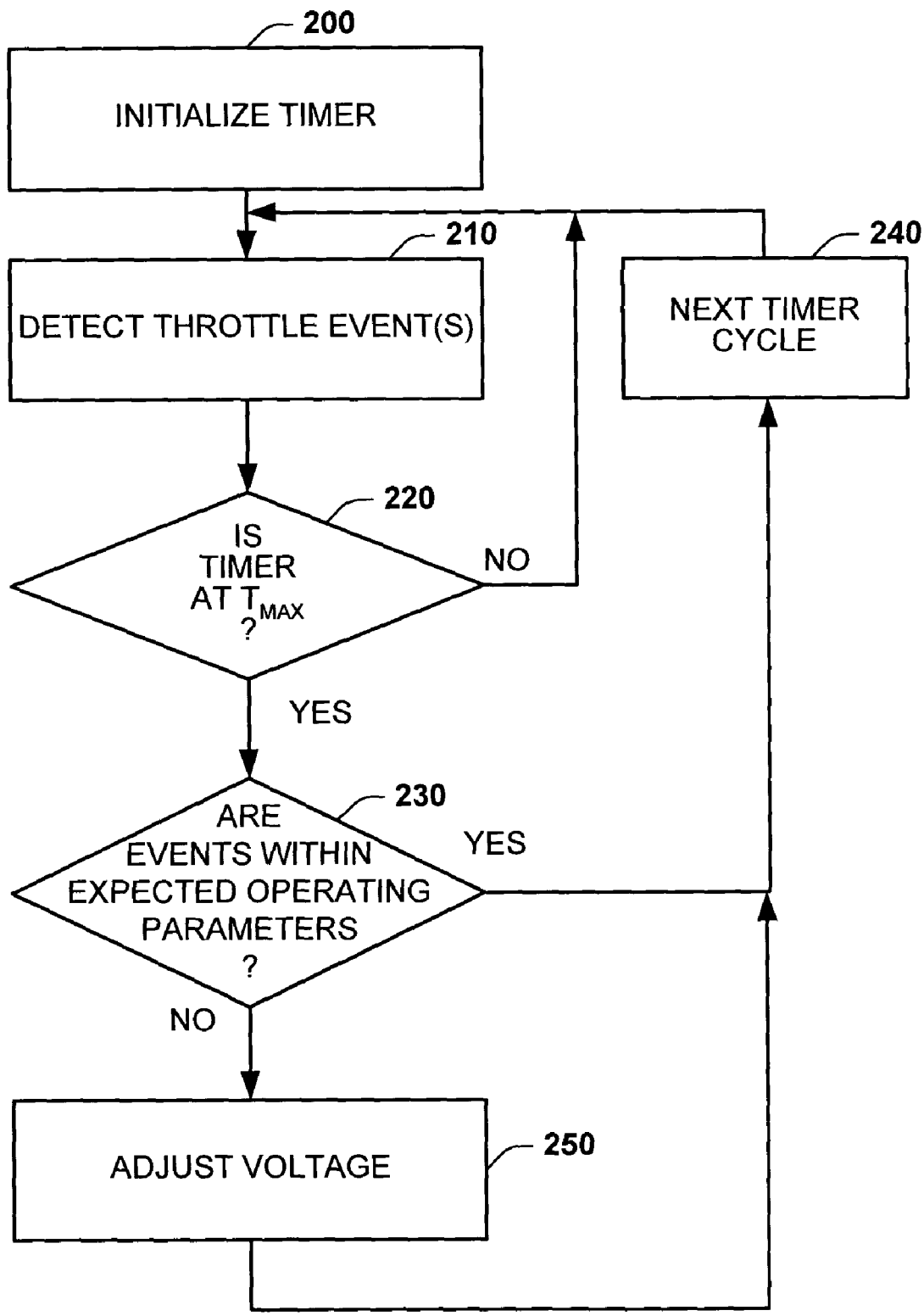
FIG. 5 is flow diagram depicting a methodology for adapting voltage.
Figure 6:
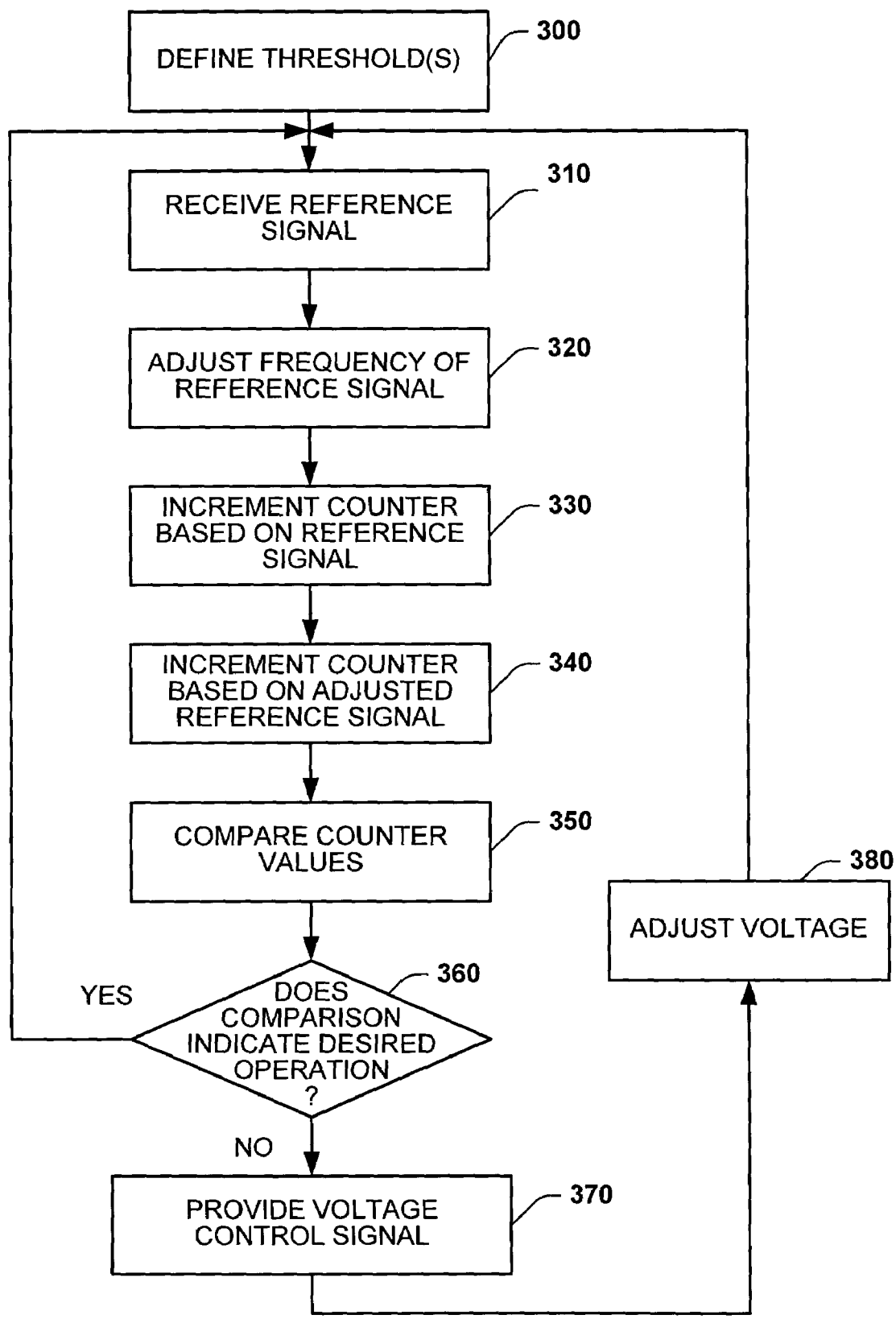
FIG. 6 is a flow diagram depicting a methodology for implementing an adaptive supply voltage.

In view of the foregoing structural and functional features described above, certain methodologies that can be implemented will be better appreciated with reference to FIGS. 5 and 6. While, for purposes of simplicity of explanation, the methodologies of FIGS. 5 and 6 are shown and described as being implemented serially, it is to be understood and appreciated that the illustrated actions, in other embodiments, may occur in different orders and/or concurrently with other actions. Moreover, not all illustrated features may be required to implement a methodology. It is to be further understood that the following methodology can be implemented in hardware, such as one or more integrated circuits, software, or any combination thereof.

FIG. 5 is a flow diagram illustrating an example of methodology for dynamically adjusting a voltage. The methodology can be implemented on an IC chip, such as part of a power control loop. The methodology begins at 200 in which a timer is initialized. The timer, for example, provides a duration (e.g., a cycle time) associated with the voltage adjustment methodology, which is typically includes numerous clock cycles. For instance, the power control cycle time can be on the order of a thousand or more times greater than a chip clock cycle time employed by logic and data paths in an associated IC implementing the methodology.

After the timer is initialized, throttle events are detected at 210. As described herein, a throttle event can correspond to an incremental, substantially instantaneous adjustment in the chip clock frequency. Such an incremental adjustment can occur in response to a corresponding increase or decrease in a voltage supply during one or more clock cycles, such as implemented by a voltage-dependent frequency generation system (e.g., a voltage controlled oscillator). A throttle event may indicate a reduction in the chip clock frequency. A reduction in chip clock frequency can be implemented to stretch the cycle time in an effort to allow associated circuitry to "catch up", such as to enable proper operation of the circuitry at a reduced supply voltage. Alternatively, stalls can be injected into the IC (e.g., a processor) to reduce switching activity and thus reduce voltage droop. This facilitates resolving operating issues associated with voltage droop. After the voltage droop issue has resolved itself, the frequency can again be increased.

At 220, a determination is made as to whether the timer has reached a maximum duration $T_{MAX}$. $T_{MAX}$ can be selected to correspond to a desired cycle time during which throttle events are detected, such as corresponding to a cycle time of a power control loop. If the timer has not timed out, the methodology returns to 210 to continue to detect throttle events associated with the clock signal. Once the timer has reached $T_{MAX}$ (YES), the methodology proceeds to 230.

At 230, a determination is made as to whether the detected throttle events are within expected operating parameters. Expected operating parameters can be defined, for example, by setting one or more threshold levels that define an acceptable number, type and/or duration of throttle events that can occur during the time period (e.g., power control cycle time) associated with the time period $T_{MAX}$. If the detected throttle events during the time period $T_{MAX}$ are within the expected operating parameters (YES), the methodology proceeds to 240 to detect throttle events for a next timer cycle. Thus, the timer is reinitialized or reset for continued detection of throttle events during the next timer cycle. During this mode of operation, no adjustments to the voltage are required.

If the throttle events are not within expected operating parameters (NO), the methodology proceeds to 250 in which the voltage is adjusted accordingly. For example, if the number of throttle events is below a predetermined threshold number (indicating wasted power), the voltage can be decreased. The decrease in voltage can be a fixed incremental level or, alternatively, it can vary as a function of the detected throttle events. Additionally, the detected throttle events can result in the voltage being increased at 250, such as where the detected throttle events indicate that the number of throttle events exceed a predetermined threshold number. After the voltage is adjusted (up or down) at 250, the methodology proceeds to 240 to implement the methodology for a next cycle. The methodology can be repeated, such as for subsequent cycles of the power control loop.

FIG. 6 illustrates a methodology for implementing adaptive voltage control. The methodology begins at 300 in which one or more threshold values are defined. The one or more threshold values define one or more relationships between voltage and frequency for which adjustments to the voltage may be implemented. The threshold values can be set by the designer or, alternatively, the one or more thresholds can be programmable by the customer or other user.

At 310, a reference signal is received. The reference signal alternates between normally high and low levels at a desired frequency, such as fixed at a maximum clock frequency for an IC implementing the methodology. At 320, a frequency of the reference signal is modified based on a reference voltage (e.g., a supply voltage). For example, the frequency of the reference signal is adjusted up or down according to how associated critical path logic in the IC would process the reference signal in response to high-frequency fluctuations in the reference voltage. Thus, depending on the instantaneous reference voltage, the frequency can be adjusted up or down to decrease or increase its associated cycle time. The frequency adjustments at 320 are to facilitate proper operation of the critical path logic during fluctuations in the reference voltage.

At 330, a first counter is incremented based on the reference signal. For example, the counter provides a value indicative of the number of cycles associated with the reference signal. At 340, a second counter is incremented based on the modified reference signal provided at 320, thereby providing an indication of the number of cycles provided by the modified reference signal.

At 350, the counter values provided at 330 and 340 are compared. The comparison can be made after a predetermined time period. For example, the predetermined time period can correspond to a defined number of the clock cycles associated with the reference signal. Alternatively, the comparison can be made after a predetermined time period based on a timer or other clock signal associated with voltage regulation circuitry. For instance, the counters can be incremented at 330 and 340 over a time period associated with the cycle time for a power control loop.

At 360, a determination is made as to whether the comparison at 350 indicates desired (e.g., substantially optimal) operation of the circuitry. The determination at 360 can be made by correlating the comparison at 350 relative to the one or more thresholds defined at 300. If the comparison of the counter values indicates desired operation of the circuitry (YES), the methodology returns to 310 in which the methodology can be repeated. For example, where the counter value associated with the modified reference signal is less than the counter value associated with the reference signal, but is greater than a corresponding threshold value, it can be inferred that the voltage is sufficiently high, such that the IC chip is operating near its maximum frequency with a sufficiently low voltage. Under such circumstances, the methodology can return from 360 to 310 without adjusting the voltage.

If the count value comparison at 350 does not indicate optimal operation (NO), the methodology proceeds from 360 to 370. At 370, a voltage control signal is provided to dynamically adjust the voltage based on the determination at 360. From 370, the methodology proceeds to 380 in which the voltage is adjusted based on the control signal. The control signal provided at 370 can indicate that the voltage is to be increased or decreased, depending on the basis for the determination at 360.

For example, where the counter value associated with the modified reference signal is lower than the counter value associated with the reference signal by at least one of the thresholds defined at 300, the voltage control signal provided at 370 can indicate that the voltage is to be decreased. The voltage control signal provided at 370 can provide a desired voltage resolution by incrementally adjusting the voltage between predefined minimum and maximum voltages.

Additionally, the voltage control signal provided at 370 can implement an increase in the voltage based on the determination at 360. For example, where the comparison at 350 indicates that the counter value associated with the modified reference signal is greater than or equal to the counter value associated with the reference signal (e.g., no net throttle events), it can be inferred that the voltage is too high. In this situation, the control signal provided at 370 can cause a corresponding decrease in the voltage. This condition generally corresponds to circumstances of wasted power. The voltage adjustment at 380 will decrease the voltage accordingly.

Figure 7:
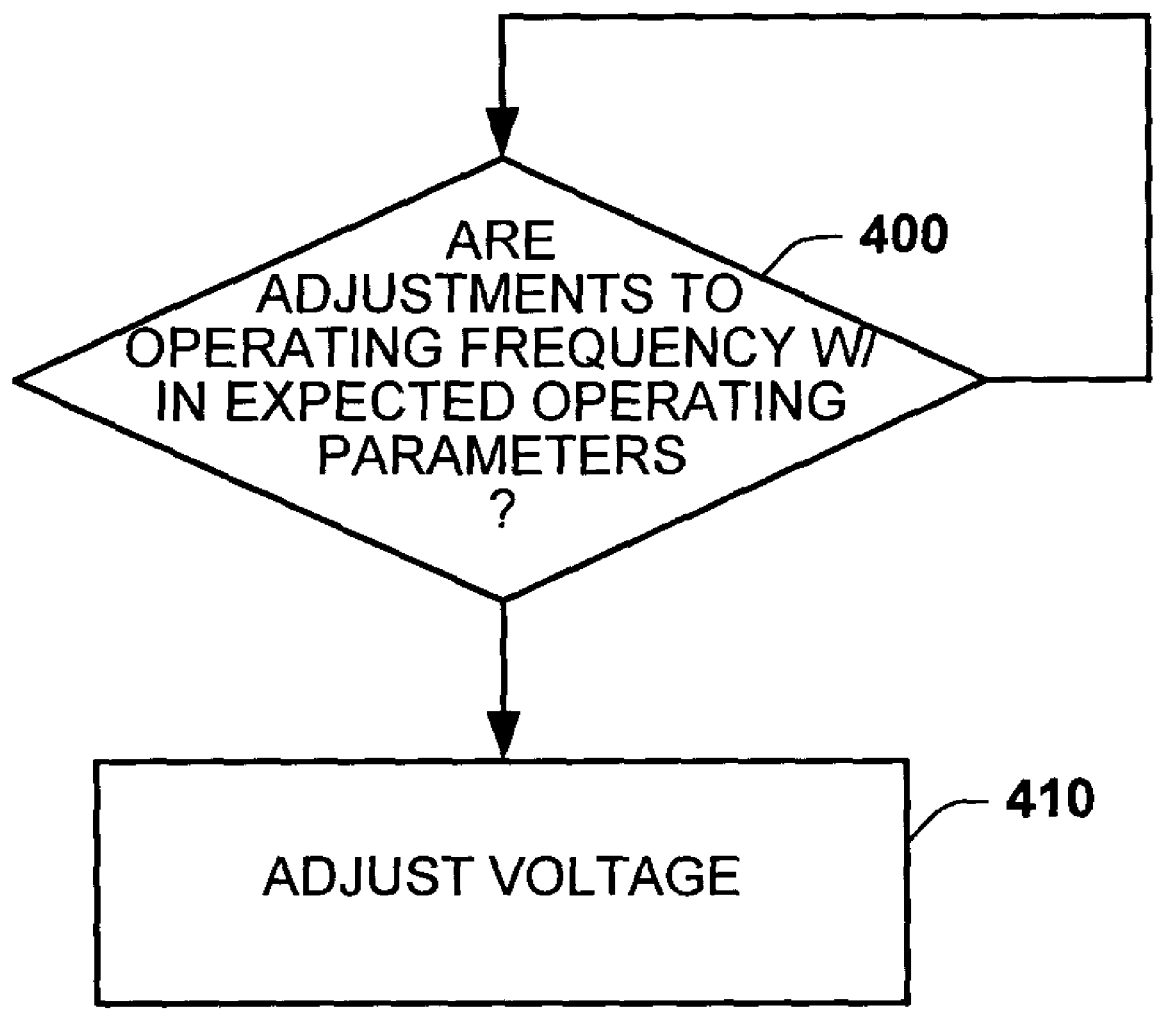
FIG. 7 is a flow diagram depicting another methodology for adjusting a supply voltage.

Another embodiment of a method for adjusting a supply voltage of an integrated circuit is illustrated in FIG. 7. The methodology comprises determining whether adjustments to an operating frequency of an integrated circuit are within expected operating parameters based on adjustments made to the operating frequency performed over a cycle time that includes a plurality of cycles at the operating frequency, as shown at 400. The method further includes adjusting the supply voltage is adjusted based on the determination, as shown at 410.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system comprising:
   a frequency generator that provides a clock signal having a frequency that varies based on an operating voltage; and
   a controller that provides a control signal to adjust the operating voltage based on adjustments to the frequency of the clock signal, wherein the controller provides the control signal based on a number of cycles for the clock signal relative to a number of cycles for a second signal over a cycle time that encompasses plural cycles associated with the clock signal and the second signal, the second signal having a substantially fixed frequency, wherein the clock signal defines a variable clock signal and the second signal defines a signal having a substantially fixed maximum frequency for the clock signal.

2. A system comprising:
a frequency generator that provides a clock signal having a frequency that varies based on an operating voltage;
a controller that provides a control signal to adjust the operating voltage based on adjustments to the frequency of the clock signal;
a comparator operative to ascertain an indication of throttle events associated with the frequency generator implementing changes to the frequency of the clock signal, the controller providing the control signal based on the indication of throttle events; and
first and second counters, the first counter being operative to count a number cycles associated with the clock signal, the second counter being operative to count a number cycles associated with a second signal having a substantially fixed frequency, the comparator ascertaining the indication of throttle events based on the relative number of cycles counted by the first and second counters.

3. A system comprising:
a frequency generator that provides a clock signal having a frequency that varies based on an operating voltage;
a controller that provides a control signal to adjust the operating voltage based on adjustments to the frequency of the clock signal; and
first and second counters, the first counter being operative to count a number cycles associated with the clock signal, the second counter being operative to count a number cycles associated with a second signal having a substantially fixed frequency, the controller providing the control signal based on the relative number of cycles counted by the first and second counters.

4. The system of claim 3, wherein the relative number of cycles indicated by the first and second counters corresponds to an average indication of a number of changes implemented by the frequency generator to the frequency of the clock signal.

5. A system comprising:
a frequency generator that provides a clock signal having a frequency that varies based on an operating voltage;
a controller that provides a control signal to adjust the operating voltage based on adjustments to the frequency of the clock signal; and
a second frequency generator that provides a second signal having a substantially fixed frequency corresponding to a desired maximum frequency for the clock signal.

6. A system to adjust voltage, comprising:
means for providing an indication of voltage induced throttle events for an integrated circuit; and
means for controlling a supply voltage of the integrated circuit based on the indication of throttle events;
means for determining a number of cycles for the clock signal relative to a number of cycles for a second signal having a substantially fixed frequency, the determined number of cycles providing an indication of throttle events associated with changes in a frequency of the clock signal, wherein the means for determining further comprising:
means for counting cycles of the clock signal; and
means for counting cycles of the second signal,
the means for controlling adjusting the supply voltage of the integrated circuit based on a relative number of cycles counted by each of the means for counting cycles.

7. A method comprising:
determining whether adjustments to an operating frequency of an integrated circuit are within expected operating parameters based on adjustments made to the operating frequency performed over a cycle time that includes a plurality of cycles at the operating frequency;
adjusting a supply voltage based on the determination;
counting a number of cycles associated with a first reference signal having a substantially fixed frequency at a maximum operating frequency;
counting a number of cycles associated with a second reference signal provided at the operating frequency that varies based on the supply voltage; and
comparing the number of cycles associated with the first reference signal relative to the number of cycles associated with the second reference signal, the adjustment to the supply voltage being made based on the comparison.

8. The method of claim 7, further comprising ascertaining an indication of throttle events associated with adjustments to the frequency of the second reference signal based on the comparison, the adjustment to the supply voltage being made based on the indication of throttle events.

9. The method of claim 8, wherein the adjustment to the supply voltage are made based on comparing the indication of throttle events relative to at least one threshold, the adjustment to the supply voltage being made based on the comparison.

10. The method of claim 9, further comprising programming the at least one threshold to define operating categories for adjusting the supply voltage.

* * * * *